US009989232B2

(12) United States Patent
Burke et al.

(10) Patent No.: US 9,989,232 B2
(45) Date of Patent: Jun. 5, 2018

(54) SHELF HEIGHT ADJUSTING FLIPPERS HAVING AN INTEGRATED ELECTRICAL CONTACT

(71) Applicant: Whirlpool Corporation, Benton Harbor, MI (US)

(72) Inventors: Julia B. Burke, Chicago, IL (US);
Daniel Chow, St. Joseph, MI (US);
Juan F. Flores, Stevensville, MI (US);
Michael T. Moore, Paw Paw, MI (US);
Douglas Pohl, Davenport, IA (US);
Todd Tunzi, St. Joseph, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 358 days.

(21) Appl. No.: 14/659,717

(22) Filed: Mar. 17, 2015

(65) Prior Publication Data
US 2016/0273750 A1 Sep. 22, 2016

(51) Int. Cl.
*F21V 33/00* (2006.01)
*F21V 23/06* (2006.01)
*H05K 5/02* (2006.01)
*F21V 23/00* (2015.01)
*F25D 25/02* (2006.01)
*F25D 27/00* (2006.01)
*F21W 131/305* (2006.01)

(52) U.S. Cl.
CPC ............ *F21V 23/06* (2013.01); *F21V 23/002* (2013.01); *F21V 33/0012* (2013.01); *F25D 25/02* (2013.01); *F25D 27/00* (2013.01); *H05K 5/0217* (2013.01); *H05K 5/0247* (2013.01); *F21W 2131/305* (2013.01)

(58) Field of Classification Search
CPC .... F21V 23/06; F21V 23/002; F21V 33/0012; F25D 25/02; F25D 27/00; H05K 5/0217; H05K 5/0247; F21W 2131/305
USPC .......................................................... 362/85
See application file for complete search history.

(56) References Cited

U.S. PATENT DOCUMENTS

| 2,852,329 | A | 9/1958 | Smith |
| 2,860,942 | A | 11/1958 | Carew |
| 2,998,290 | A | 8/1961 | Sharpe |
| 3,397,934 | A | 8/1968 | Dushek |
| 7,338,180 | B2 | 3/2008 | Wing |
| 8,100,488 | B2 | 1/2012 | Eisele et al. |

(Continued)

FOREIGN PATENT DOCUMENTS

| EP | 1491835 | 11/2005 |
| WO | 2012021807 | 2/2012 |

*Primary Examiner* — Elmito Breval
*Assistant Examiner* — Jessica M Apenteng
(74) *Attorney, Agent, or Firm* — Price Heneveld LLP

(57) ABSTRACT

A height-adjustable shelving system for an appliance includes an appliance having a plurality of walls that define an interior cavity. The appliance has an electrical system that extends into at least one of the walls of the appliance. A shelf is selectively disposed within the cavity and includes a lighting fixture. A shelf support system in communication with the electrical system includes at least one rotatable body operable between a plurality of support positions, the at least one rotatable body removably receiving and supporting the shelf, wherein each of the support positions of the rotatable body corresponds to a different shelf height. The removable engagement between the shelf and the rotatable body in any of the plurality of support positions places the lighting fixture in communication with the electrical system.

14 Claims, 12 Drawing Sheets

(56) References Cited

U.S. PATENT DOCUMENTS

| | | |
|---|---|---|
| 8,297,726 B2 | 10/2012 | Ramm et al. |
| 8,814,288 B2 | 8/2014 | McDaniel et al. |
| 8,911,042 B2 | 12/2014 | Bassi et al. |
| 8,967,740 B2 | 3/2015 | Kerner |
| 2004/0195945 A1 | 10/2004 | Farber et al. |
| 2013/0088136 A1 | 4/2013 | Bassi et al. |
| 2014/0220833 A1 | 8/2014 | Kerner |

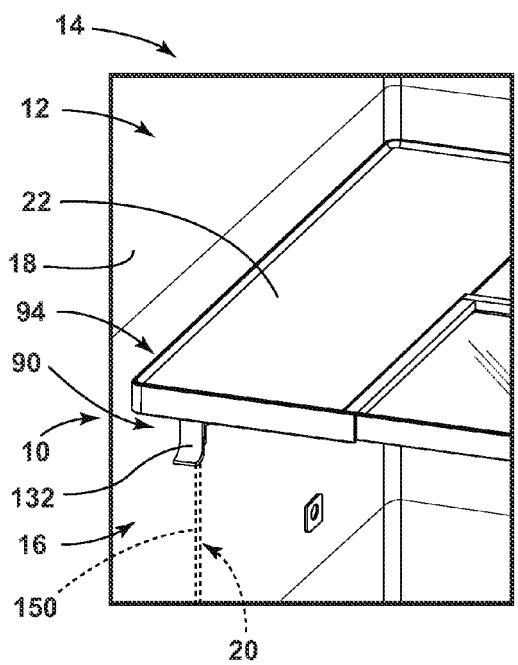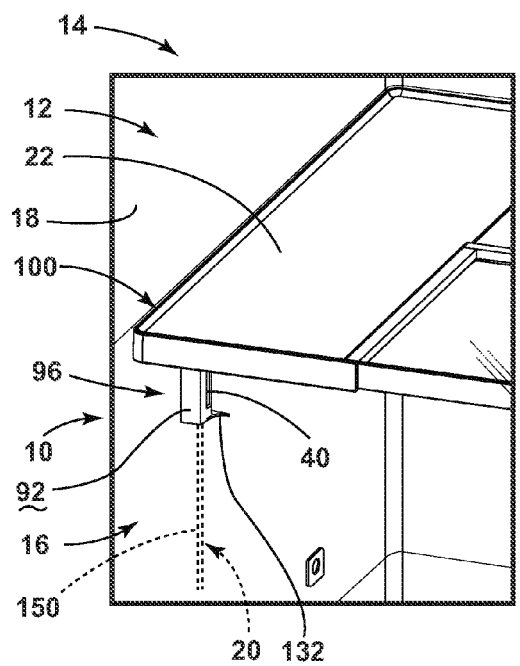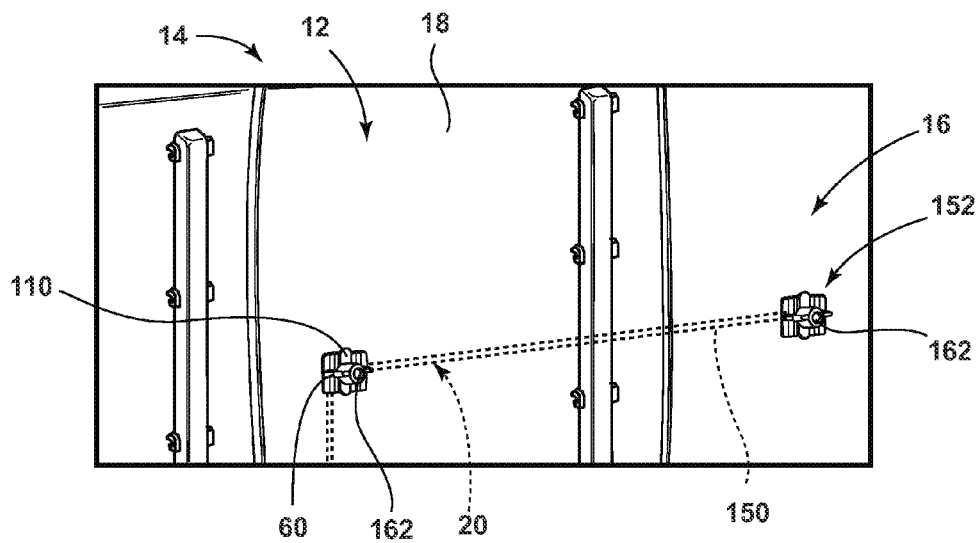

SHELF HEIGHT ADJUSTING FLIPPERS HAVING AN INTEGRATED ELECTRICAL CONTACT

FIELD OF THE INVENTION

The present invention generally relates to height-adjustable shelving for appliances, and more specifically, height adjusting flippers that are operable to adjust the height of the shelving within the appliance and also deliver electricity to electrical functions within the appliance shelving.

BRIEF SUMMARY OF THE INVENTION

A height-adjustable shelving system for an appliance includes an appliance having a plurality of walls that define an interior cavity. The appliance has an electrical system that extends into at least one of the walls of the appliance. A shelf is selectively disposed within the cavity and includes a lighting fixture. A shelf support system in communication with the electrical system includes at least one rotatable body, such as a rotatable flipper, operable between a plurality of support positions, the at least one rotatable body removably receiving and supporting the shelf, wherein each of the support positions of the rotatable body corresponds to a different shelf height. The removable engagement between the shelf and the rotatable body in any of the plurality of support positions places the lighting fixture in communication with the electrical system.

An operable shelf support for delivering electrical power to a light fixture disposed within a height-adjustable shelf for a refrigerator includes a rotatable body having an electrical contact disposed therein. The rotatable body has a plurality of support positions and a plurality of support surfaces, wherein each support position of the plurality of support positions corresponds to a respective support surface of the plurality of support surfaces. A stud is positioned on a wall of the refrigerator and is in communication with an electrical system of the refrigerator and the electrical contact of the rotatable body, the rotatable body being rotatably disposed on the stud and rotatable about the stud between the plurality of support positions. Each respective support surface defined by the plurality of support positions, in turn, defines a different height relative to the stud, and wherein each respective support surface is configured to receive and support a height-adjustable shelf and engage an electric receiver of the height-adjustable shelf to place a light fixture of the height-adjustable shelf in communication with the electrical system of the refrigerator through the engagement of the electrical contact and the electrical receiver.

A height-adjustable lighting system for an appliance includes a lighting fixture removably engaged with a cavity of an appliance. The cavity is defined by a plurality of walls and the lighting fixture includes an engagement surface and an electrical receiver disposed proximate the engagement surface. At least a portion of the electrical system is positioned within at least one of the walls of the appliance. An operable support structure is positioned within the cavity and receives the engagement surface to support the lighting fixture. The operable support structure is operable between a plurality of support positions. Each of the plurality of support positions corresponds to a respective plurality of fixture heights of the lighting fixture. An electrical contact is disposed within a portion of the operable support structure and is in communication with the electrical system. The electrical contact is positioned to engage the electrical receiver of the lighting fixture when the engagement surface is received by the operable support structure in each of the plurality of support positions of the operable support structure. The engagement of the electrical contact and the electrical receiver places the lighting fixture in communication with the electrical system.

These and other features, advantages, and objects of the present invention will be further understood and appreciated by those skilled in the art by reference to the following specification, claims, and appended drawings.

BRIEF DESCRIPTION OF THE DRAWINGS

The foregoing summary, as well as the following detailed description of the invention, will be better understood when read in conjunction with the appended drawings. For the purpose of illustrating the invention, there are shown in the drawings, certain embodiment(s) which are presently preferred. It should be understood, however, that the invention is not limited to the precise arrangements and instrumentalities shown. Drawings are not necessary to scale. Certain features of the invention may be exaggerated in scale or shown in schematic form in the interest of clarity and conciseness.

FIG. 6 is a top perspective view of one of the appliance shelves resting upon the shelf-supporting system according to the embodiment of FIG. 2;

FIG. 7 is a top perspective view of one of the appliance shelves resting upon the shelf support system according to the embodiment of FIG. 3;

FIG. 8 is a side perspective view of the refrigerating appliance of FIG. 1 with the adjustable shelves and rotatable flippers removed exposing the studs that support the shelf-adjusting flippers;

DETAILED DESCRIPTION

Figure 1:
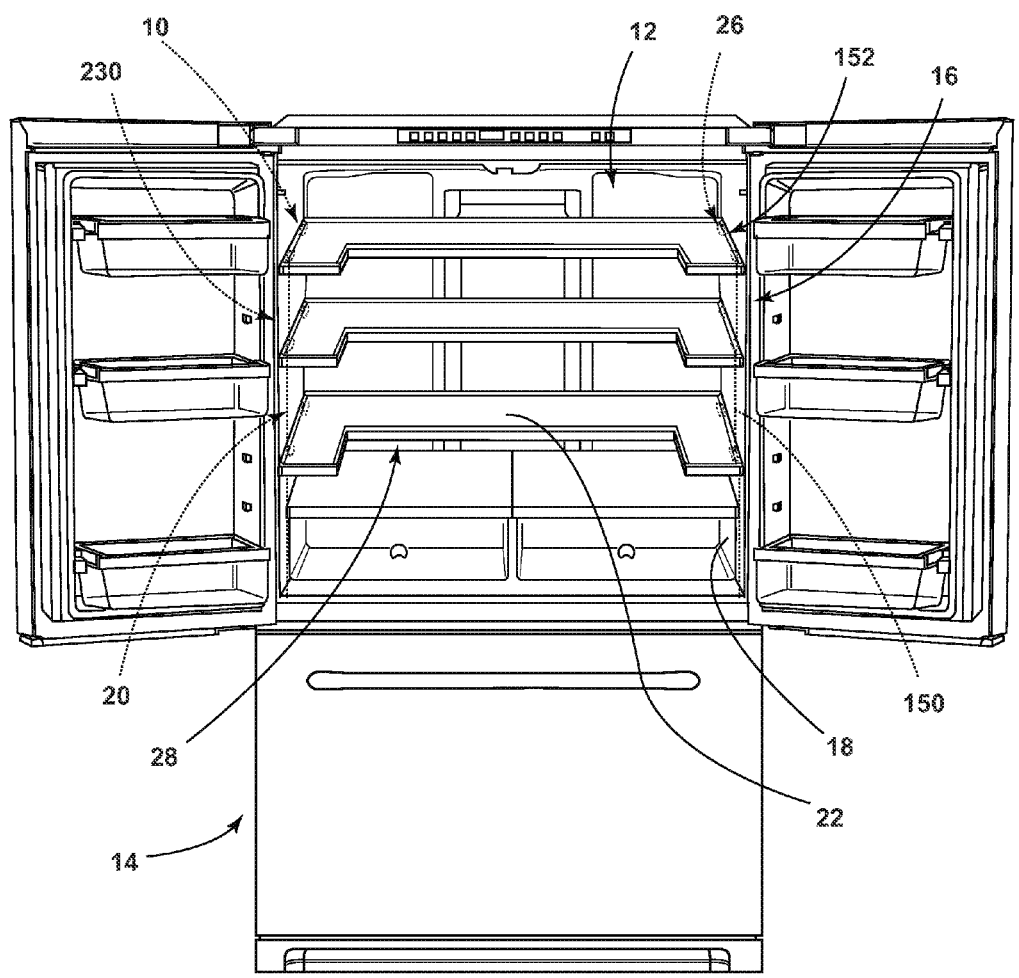
FIG. 1 is a front perspective view of a refrigerator containing one embodiment of the shelf-supporting system supporting various shelves disposed within the appliance.

Before the subject invention is described further, it is to be understood that the invention is not limited to the particular embodiments of the invention described below, as variations of the particular embodiments may be made and still fall within the scope of the appended claims. It is also to be understood that the terminology employed is for the purpose of describing particular embodiments, and is not intended to be limiting. Instead, the scope of the present invention will be established by the appended claims.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention.

In this specification and the appended claims, the singular forms "a," "an" and "the" include plural reference unless the context clearly dictates otherwise.

As illustrated in FIGS. 1-8, reference numeral 10 generally refers to an adjustable body, such as a rotatable flipper, that is installed within the cavity 12 of an appliance 14, such as a refrigerating or freezing appliance, typically within the refrigerator compartment of a residential refrigerator. The adjustable body can be part of a height-adjustable shelf-supporting system 16 for the appliance 14, where the height-adjustable shelf-supporting system 16 includes the appliance 14 having a plurality of walls 18 that define the interior cavity 12, and where the appliance 14 includes an electrical system 20 that extends into at least one of the walls 18 of the appliance 14. A shelf 22 for the appliance 14 is selectively disposed within the cavity 12 and includes at least one lighting fixture 24. The shelf-supporting system 16 for the height-adjustable shelf 22 is typically in electrical communication with the electrical system 20 and includes at least one adjustable body, in the form of the rotatable flipper 10, that is operable between a plurality of support positions 26; however, an electrical system does not necessarily need to be employed. The at least one rotatable flipper 10 is adapted to be removably received and support the shelf 22, wherein each of the support positions 26 of the rotatable flipper 10 corresponds to a respective shelf height 28. The removable engagement between the shelf 22 and the rotatable flipper 10 in any of the plurality of support positions 26 serves to place the lighting fixture 24 in electrical communication with the electrical system 20 of the appliance 14.

According to the various embodiments, the shelf 22 of the height-adjustable shelf-supporting system 16 is removable from the shelf-supporting system 16 and from the cavity 12 of the appliance 14 by hand and without the use of tools. As will be discussed more fully below, the placement of the shelf 22 upon the one or more rotatable flippers 10 of the shelf-supporting system 16 serves to place the lighting fixture 24 in electrical communication with the electrical system 20 of the appliance 14, such that no additional tools or fasteners are necessary.

Referring again to the embodiment illustrated in FIGS. 1-8, the at least one rotatable flipper 10 of the shelf-supporting system 16 includes an electrical contact 40 to engage with the shelf 22 when the rotatable flipper 10 is in any of the plurality of support positions 26. According to the various embodiments, the shelf 22 can include an electrical receiver 42 configured to engage with the electrical contact 40 when the rotatable flipper 10 is in any of the plurality of support positions 26. It is also contemplated that the electrical receiver 42 is positioned within a support recess 44 of the shelf 22. The support recess 44 is configured to surround at least a portion of the rotatable flipper 10 when the rotatable body is in any of the plurality of support positions 26. In this manner, as the support recess 44 surrounds a portion of the rotatable flipper 10, the engagement substantially secures the shelf 22 onto the rotatable flipper 10, such that the shelf 22 is substantially unable to inadvertently slide off from the rotatable flipper 10. Rather, in order to remove the shelf 22 from the cavity 12 of the appliance 14 and off from the rotatable flipper 10 of the shelf-supporting system 16, the shelf 22 must first be lifted and then pulled out from the cavity 12 of the appliance 14.

Referring again to the embodiment illustrated in FIGS. 1-9, the shelf-supporting system 16 can include a stud 60 that is positioned on one of the walls 18 of the refrigerator, where the stud 60 is configured to be in communication with the electrical system 20 of the appliance 14 and also in electrical communication with the electrical contact 40 of the rotatable flipper 10. The rotatable flipper 10 is rotatably disposed on the stud 60, such that the rotatable flipper 10 can be operably rotated about the stud 60 between the various support positions 26 of the rotatable flipper 10. It is contemplated that each support position 26 of the plurality of support positions 26 corresponds to a respective support surface 62 of the rotatable flipper 10. Accordingly, each support position 26 relates to the positioning of a different support surface 62 of the rotatable flipper 10 being positioned to receive at least a portion of the support recess 44 of the shelf 22. In this manner, as the rotatable flipper 10 is moved between various support positions 26, a different support surface 62 is positioned above the stud 60 and substantially parallel with a bottom wall 18 of the cavity 12 of the appliance 14 to receive the shelf 22 in a substantially flush configuration. Additionally, as the rotatable flipper 10 is moved between the various support positions 26, each support surface 62 defined by the respective support position 26 defines a different respective shelf height 28 relative to the stud 60 such that the shelf 22 is placed upon the various support surfaces 62 as the rotatable body is rotated between the various support positions 26.

Referring now to the embodiments illustrated in FIGS. 5-12, the stud 60 includes a post 80 that extends from a wall 18 of the appliance 14, where the stud 60 engages the electrical system 20 of the appliance 14. The stud 60 extends into the rotatable flipper 10. The post 80 engages the rotatable flipper 10 in a substantially offset configuration within the rotatable flipper 10. In this manner, as the rotatable flipper 10 rotates about the post 80, the various support surfaces 62 of the rotatable flipper 10 can be positioned at the respective shelf heights 28 relative to the post 80 and the stud 60. It is contemplated that the post 80 can be vertically offset within the rotatable body, or can be laterally offset within the rotatable body. It is also contemplated that the post 80 can be both vertically and laterally offset within the rotatable body. Accordingly, the various support surfaces 62 of the rotatable flipper 10 are configured to be different distances from the post 80 and the stud 60. These varying distances between the support surfaces 62 and the stud 60 serve to provide the respective shelf heights 28 defined by the plurality of support positions 26 of the rotatable flipper 10.

Figure 11:
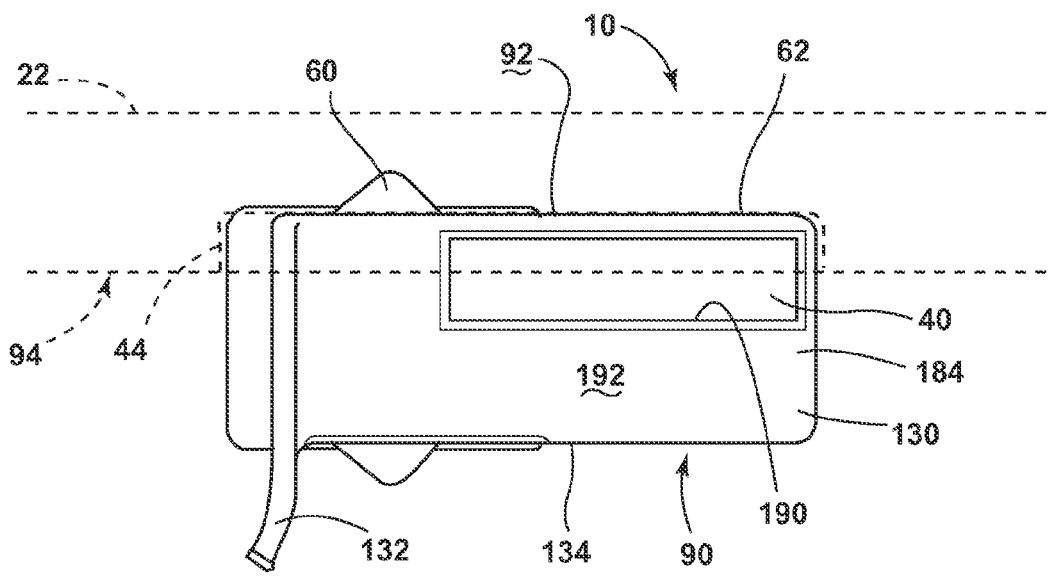
FIG. 11 is a side elevational view of the adjustable flipper of FIG. 9 in a lower first support position.
Figure 12:
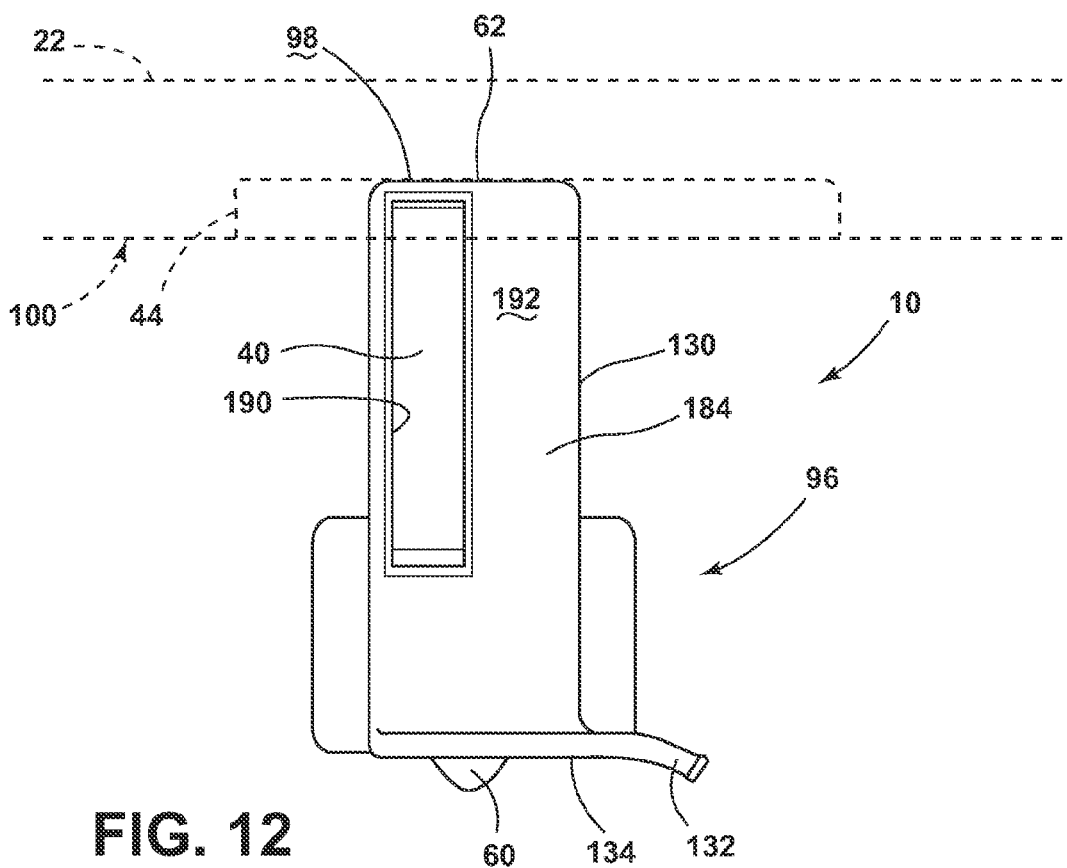
FIG. 12 is a side perspective view of the adjustable flipper of FIG. 11 with the adjustable flipper in a higher second support position.
Figure 13:
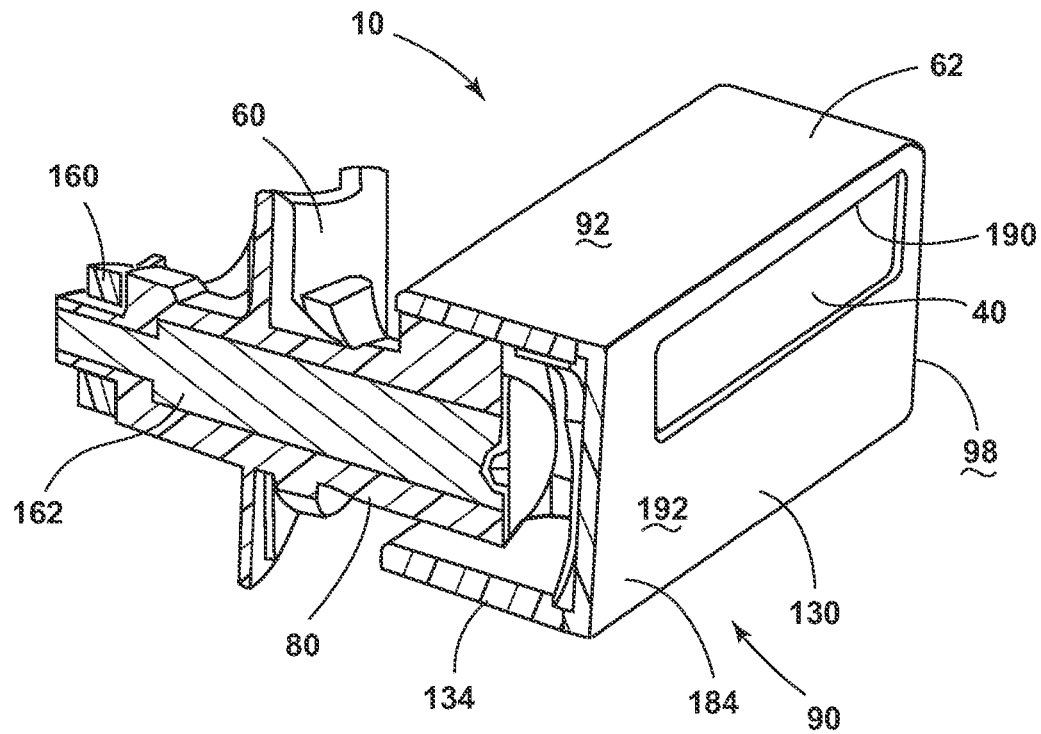
FIG. 13 is a cross-sectional view of the adjustable flipper of FIG. 9 taken along line XIII-XIII.
Figure 14:
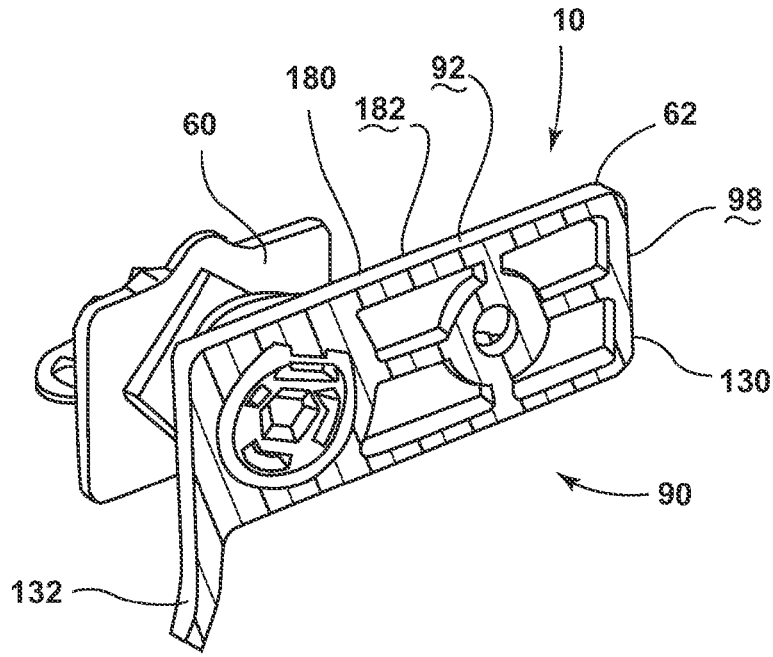
FIG. 14 is a cross-sectional view of the adjustable flipper of FIG. 9 taken along line XIV-XIV.

Referring to FIGS. 11 and 12, the plurality of support positions 26 can include a lower first support position 90 where a first support surface 92 is positioned above the stud 60 and prepared to support the shelf 22 at a lower shelf height 94. As illustrated, the rotatable flipper 10 is substantially elongated so that, due to the offset configuration of the stud 60, the first support surface 92 is a substantially elongated surface. When the rotatable flipper 10 is turned 90°, the rotatable flipper 10 defines a higher second support position 96, corresponding to a second support surface 98, that defines a higher shelf height 100. Accordingly, the elongated configuration of the rotatable flipper 10 provides that the second support surface 98 is a narrower surface than first support surface 92. In the various embodiments, it is contemplated that the rotatable flipper 10 can have a variety of configurations with varying numbers of supporting surfaces. Such configurations can include, but are not limited to, square, rectangular, polygonal, irregular, arcuate, combinations thereof, and other configurations. It is also contemplated that depending upon the configuration of the rotatable flipper 10, the stud 60 and post 80 may be offset, such as where the rotatable flipper 10 is a regular and substantially symmetrical shape, or can be centered, where the rotatable flipper 10 has an irregular or non-symmetrical configuration.

According to various embodiments, the rotatable flipper 10 is configured to rotate about an axis that is substantially perpendicular or perpendicular to the adjacent wall 18 of the appliance 14. It is contemplated, in various alternate embodiments, that the rotatable flipper 10 can rotate in a different manner to define the various support positions 26 of the shelf-supporting system 16. Various alternate embodiments can include the rotatable flipper 10 rotating about an axis that is substantially parallel to adjacent wall 18. In such an embodiment, the rotatable flipper 10 would roll upward against the wall 18 to define the various support positions 26. It is also contemplated that in the various embodiments, the rotatable flipper 10 can include a plurality of apertures 190 within the outer cover 130 of the rotatable flipper 10, where portions of the electrical contact 40 are accessible through each of the apertures 190.

Figure 5:
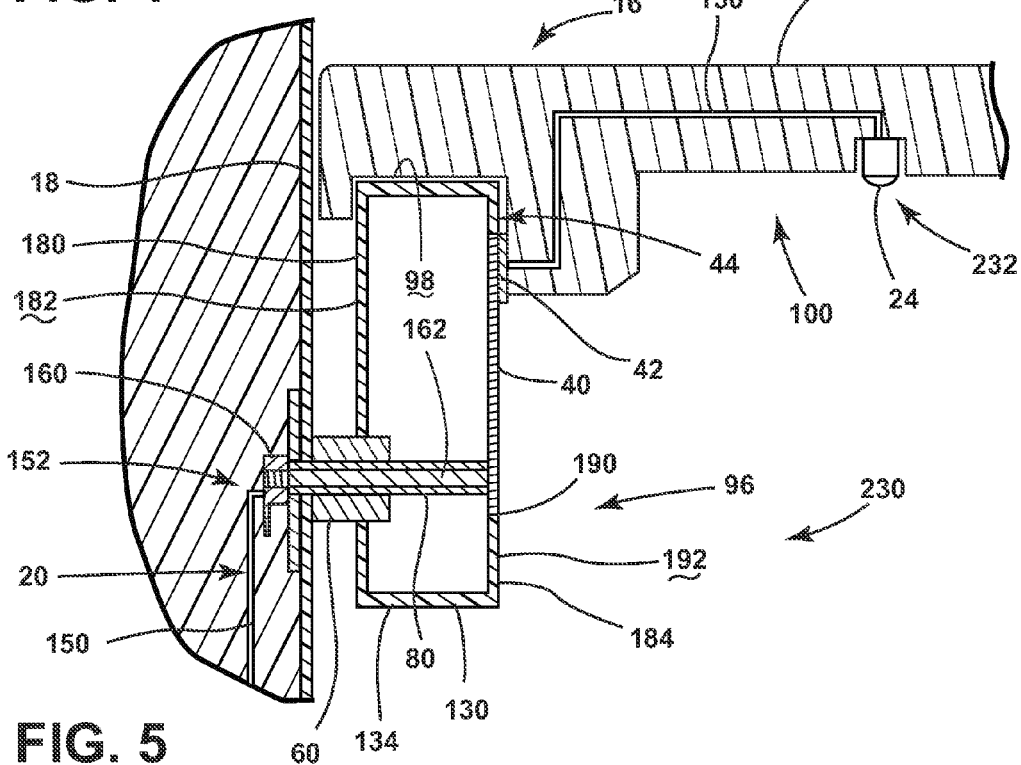
FIG. 5 is a cross-sectional view of the shelf-supporting system of FIG. 3, taken along line V-V.
Figure 9:
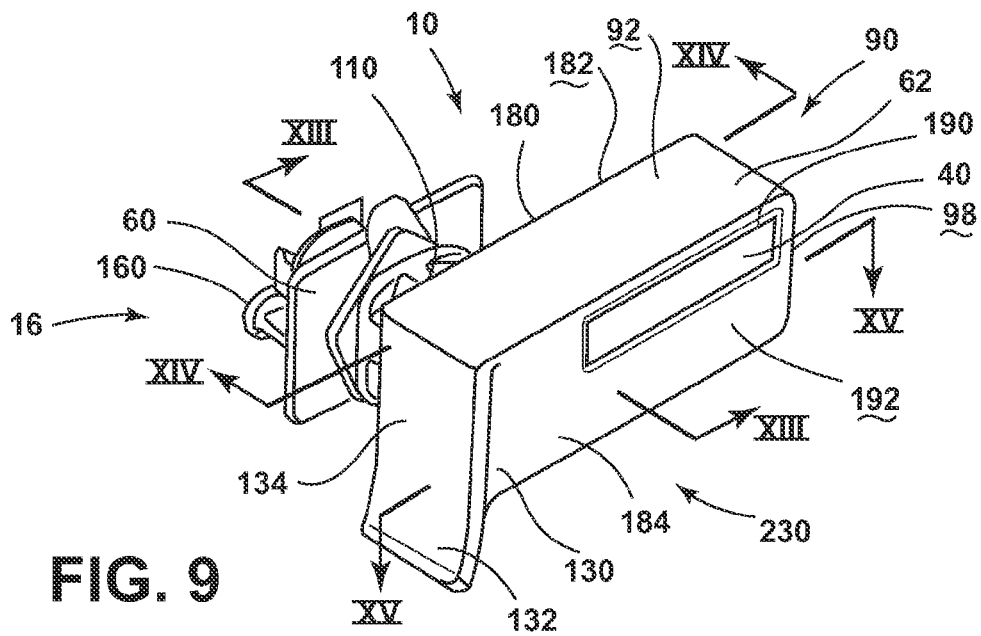
FIG. 9 is a top perspective view of one of the adjustable flippers shown removed from an appliance.

Referring now to the embodiment illustrated in FIG. 5, the stud 60 and/or the post 80 can include a detent portion 110 that extends around a portion of the stud 60. The detent portion 110 (shown in FIG. 9) of the stud 60 is configured to cooperate with the rotatable flipper 10 to selectively hold the rotatable flipper 10 in each of the plurality of support positions 26, as the rotatable flipper 10 is rotated about the stud 60. In this manner, the detent portion 110 of the stud 60 can be configured to allow for convenient rotation of the rotatable flipper 10 into each of the support positions 26 (shown in FIG. 2). The detent portion 110 also provides a sufficient retaining force to prevent unintentional rotation of the rotatable flipper 10 out of a desired support position 26. The detent portion 110 of the stud 60 is also configured to provide a light enough retaining force to allow for convenient rotation of the rotatable flipper 10 out of a particular support position 26, and into another desired support position 26 to modify the respective shelf height 28 of the shelf 22 as it rests upon the respective support surface 62 of the rotatable flipper 10.

In conventional refrigerators, shelves are attached to the walls 18 of the cavity 12 of various appliances through a "ladder" assembly that extends vertically through substantially the entire height of the cavity 12. Such ladder assemblies are difficult to conceal and are also difficult to clean. The shelf-supporting system 16 disclosed herein is entitled to replace these "ladder-type" shelf support assemblies disposed within conventional refrigerating appliances. The shelf-supporting system 16 described herein and including the various rotatable flippers 10 is configured to provide for vertical operation of the various shelves within the appliance 14, while having a minimal appearance within the cavity 12 of the appliance 14.

Figure 10:
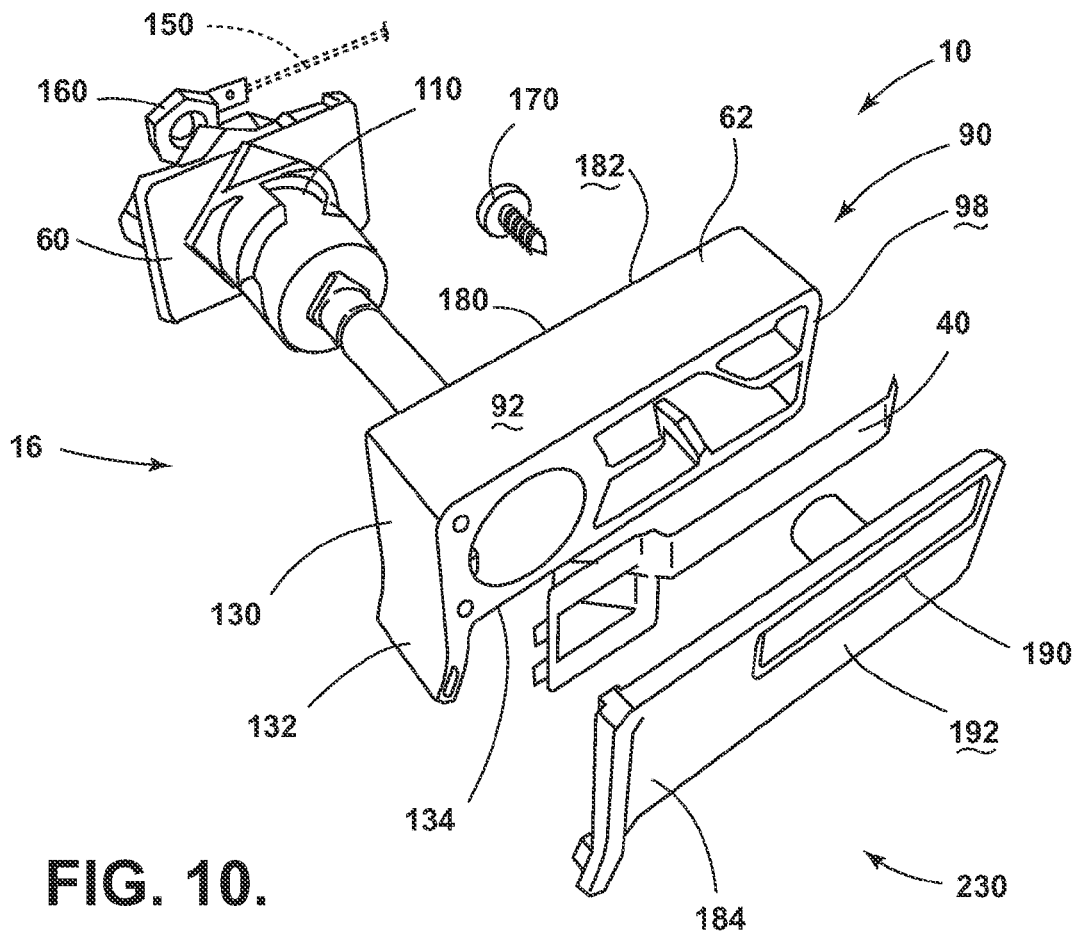
FIG. 10 is an exploded perspective view of the adjustable flipper of FIG. 5.

As illustrated in FIGS. 10-12, each of the rotatable flippers 10 can include an outer cover 130. This outer cover 130 can include a finger flange 132 that extends outward from one of the perimetrical sides 134 of the outer cover 130 of the rotatable flipper 10. The finger flange 132 is configured to provide a lever, hold or grasping point that the user can grasp the rotatable flipper 10 and rotate the rotatable flipper 10 to the desired support position 26. It is contemplated that the finger flange 132 can be an integral portion of the outer cover 130 of the rotatable flipper 10 or can be a separate piece attached to the outer cover 130 of the rotatable flipper 10. It is also contemplated that the finger flange 132 can include a curved portion, ring or other ergonomic structure to allow a user to better engage the finger flange 132.

Referring again to FIGS. 1-6, wiring 150 for the electrical system 20 of the appliance 14 is run through the walls 18 of the appliance 14 and to specific portions of the cavity 12 to engage one or more of the studs 60 of the shelf-supporting system 16. It is contemplated that only a portion of the studs 60, and in turn, the rotatable flippers 10, of the shelf-supporting system 16 are configured to be in communication with the electrical system 20 of the appliance 14. It is further contemplated that a plurality of rotatable flippers 10, such as a set of rotatable flippers 10, can be disposed within the cavity 12 at a particular vertical position 152 of the cavity 12. By way of explanation, and not limitation, a particular vertical position 152 within the cavity 12 can include a set of four rotatable flippers 10 positioned in a substantially level configuration within the cavity 12. Accordingly, each of these rotatable flippers 10 at the particular vertical position 152 of the cavity 12 are configured to support a particular shelf 22. Each of the rotatable flippers 10, at a particular vertical position 152 within the cavity 12, can each be rotated to define the various support positions 26 to adjust the respective shelf height 28 of the shelf 22 disposed on the rotatable flippers 10. It is also contemplated that only one of the rotatable flippers 10 at a particular vertical position 152 within the cavity 12 needs to be connected to the electrical system 20 of the appliance 14. In such an embodiment, when a particular shelf 22 is placed upon the various rotatable flippers 10 within a particular vertical position 152 within the cavity 12, the various electrical functions of the shelf 22, such as lighting, electrical controls, user interfaces, display panels, inductive charging/power supply surfaces and other electrical appliances, can be powered by the connection of the appliance 14 to a single electrical contact 40 disposed in one of the rotatable flippers 10. According to various alternate embodiments, each of the rotatable flippers 10 can include its own electrical contact 40, each being placed in communication with the electrical system 20 of the appliance 14. It is also contemplated that the engagement between the electrical contact 40 and the electrical receiver 42 allows communications, such as data, electrical signals, user commands, and the like, between the shelf 22 and the refrigerating appliance 14. It is also contemplated that the shelf 22 can include various sensors and/or microprocessors for gathering or receiving such communications to be used in operating the appliance 14. According to the various embodiments, the various rotatable flippers 10 can have dedicated purposes. By way of example, and not limitation, one rotatable flipper 10 can serve to deliver electrical current to the various functions of the shelf 22, and other rotatable flipper 10 can alternatively be used for delivering wired communications between the shelf 22 and the appliance 14, and vice versa. Alternatively, a single flipper may contain sufficient electrical contacts 40 such that power, communications, ground and other electrically-based functions can be performed through the engagement of a single rotatable flipper 10 with the shelf 22.

It is contemplated that the appliance 14 can include a wireless communications system that is at least partially incorporated into one or more shelves 22. In such an embodiment, a micro or other wireless communications device can be installed within a portion of the shelf 22 to provide for wireless communication to and from the appliance via Wi-Fi, Bluetooth, cellular signal, or other wireless communications network. This wireless communications system can be used by the user of the appliance 14 to deliver various commands and operating instructions to the appliance 14, or receive status information about the appliance 14, from a remote location, such as through a smart device, phone, internet connection and the like. Where the wireless communications system is at least partially disposed within the shelf 22, the wireless communications system of the appliance 14 can receive electrical power through the connection of the rotatable flippers 10 with the shelf 22.

Referring again to the embodiment illustrated in FIGS. 3-6 and 9-12, wiring 150 for the electrical system 20 of the appliance 14 can be run to one or more of the studs 60 of the shelf-supporting system 16 of the appliance 14. Within the stud 60 can be disposed an internal electrical connector 160 that receives wiring 150 from the electrical system 20 of the appliance 14. The internal electrical connector 160 can be in the form of a nut, screw 170, receptacle, or other similar electrically conductive member. Once the electrical system 20 of the appliance 14 is connected to the internal electrical connector 160, the stud 60 can include an internal electrical delivery system 162 that travels through the stud 60 and through the post 80, to engage the electrical contact 40 of the rotatable flipper 10.

According to the various embodiments, it is contemplated that the electrical contact 40 can be configured to only deliver electricity under specific predetermined conditions. Such predetermined conditions can serve as a safety and power-saving feature to prevent undesired flow of electrical current or short circuiting of the appliance 14 when an object unrelated to the shelf 22 touches the electrical contact 40. Such a failsafe can be defined by electrical power only flowing through the electrical contact 40 when at least two or more electrical contacts 40 of the various rotatable flippers 10 positioned at a particular vertical position 152 within the cavity 12 are engaged to a single electrically conductive material, such as portions of the shelf 22. In this manner, if a user touches one of the electrical contacts 40, or two separate objects touch two separate electrical contacts 40, no electricity will flow from the various electrical contacts 40 of the rotatable flippers 10. Electrical power can only be delivered through the electrical contacts 40 when a specific predetermined number of electrical contacts 40 are engaged at the same time, such as when a shelf 22, having a plurality of electrical receivers 42, engages a plurality of the electrical contacts 40 of the various rotatable flippers 10 disposed at a particular vertical position 152 within the cavity 12. It is also contemplated that each of the electrical contacts 40 can be configured to deliver electricity through induction where electricity is transferred to the various electrical mechanisms of the shelf 22, through a magnetic field generated by the electrical contact 40 that produces an induced electromagnetic field within the electrical receiver 42 of the shelf 22, thereby creating an induced electrical current within the shelf 22 that can operate the various selectable mechanisms of the shelf 22. Other mechanisms can be implemented within the shelf-supporting system 16 to prevent unintentional or undesired flow of electricity through the electrical contacts 40.

Figure 15:
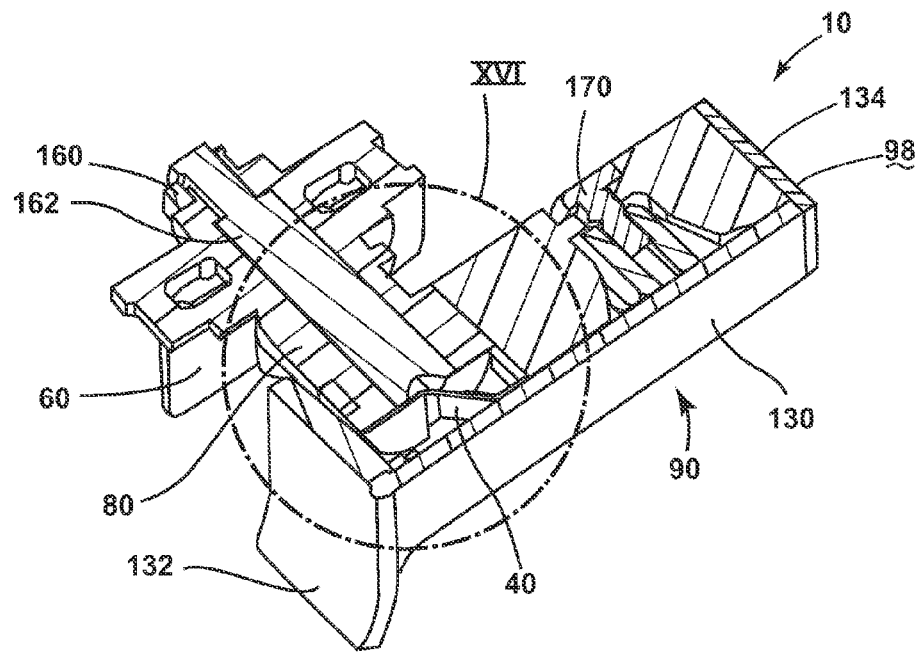
FIG. 15 is a cross-sectional view of the adjustable flipper of FIG. 9 taken along line XV-XV.
Figure 16:
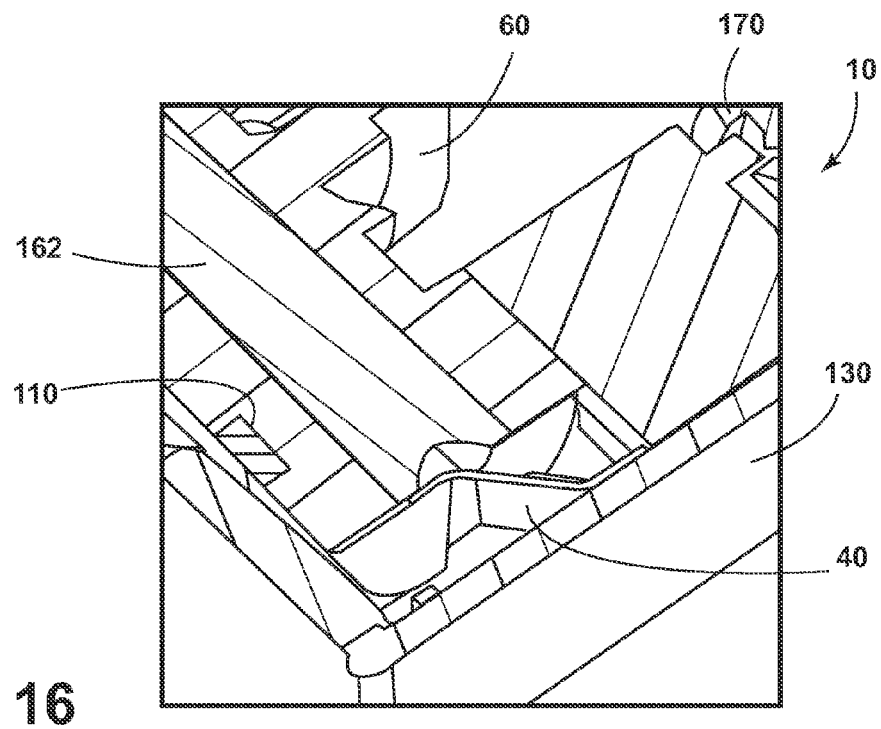
FIG. 16 is an enlarged cross-sectional view of the adjustable flipper of FIG. 15 taken at area XVI.
Figure 17:
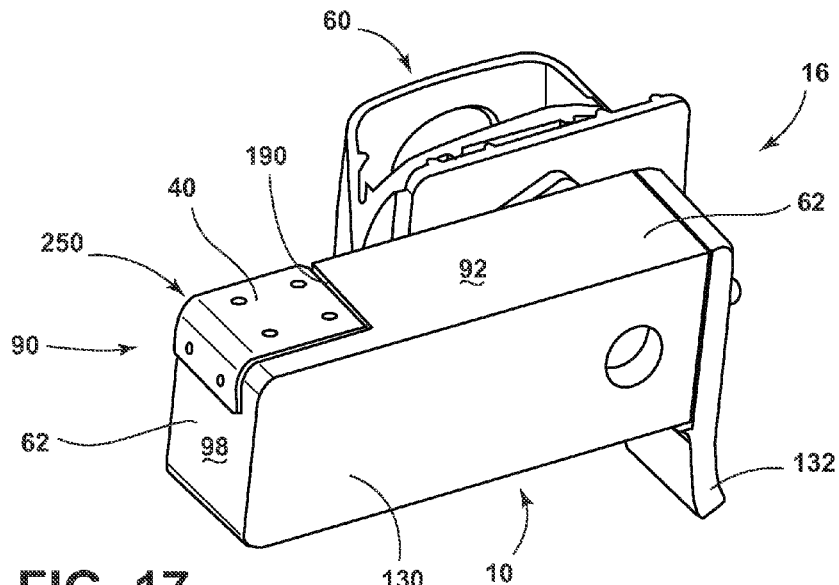
FIG. 17 is a top perspective view of an alternate embodiment of the adjustable flipper.
Figure 18:
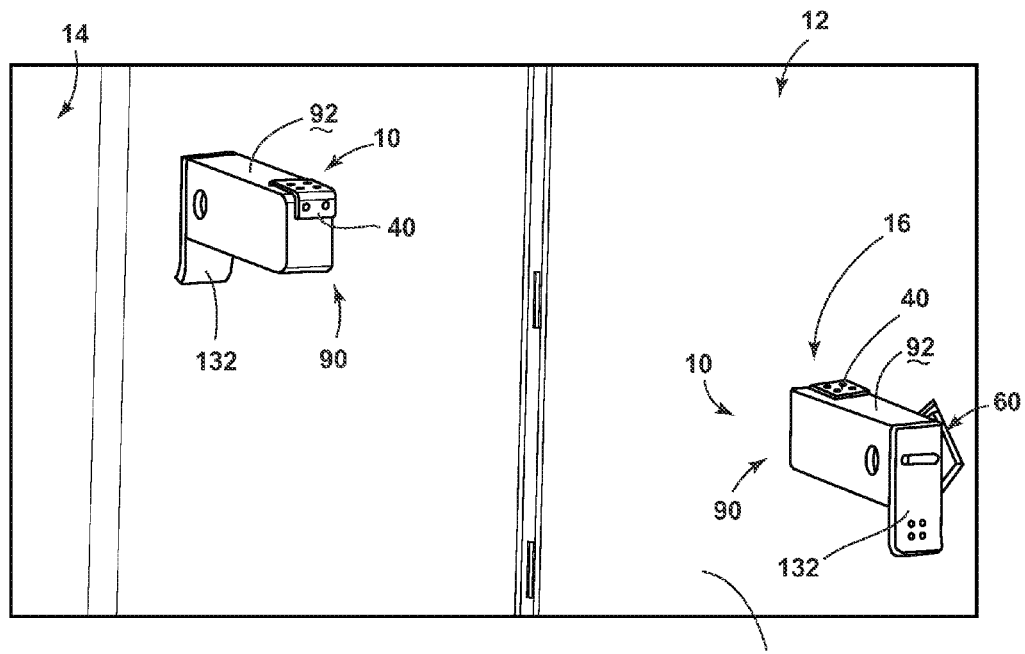
FIG. 18 is a side perspective view of an appliance incorporating the rotatable flipper of FIG. 17.
Figure 19:
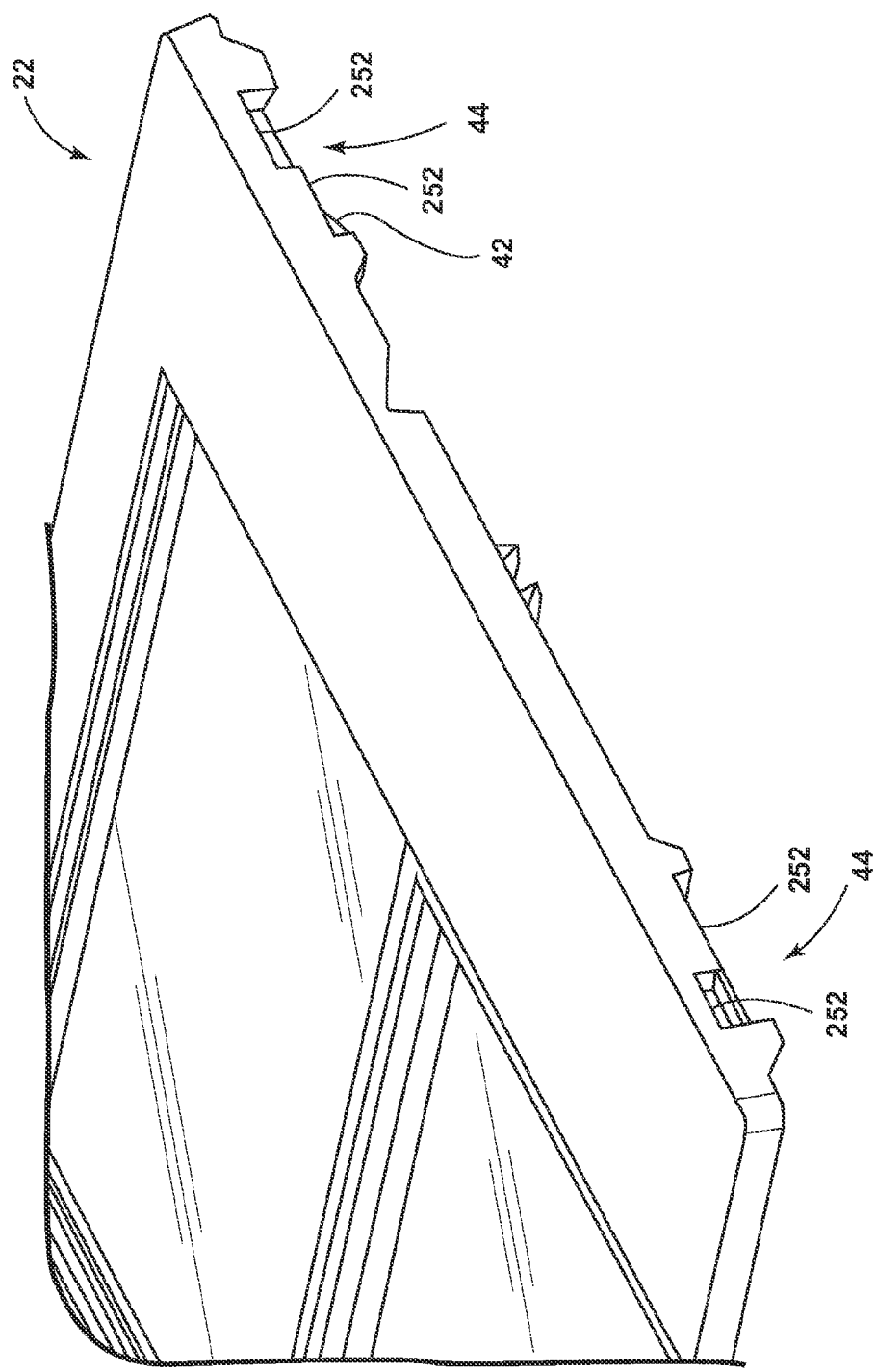
FIG. 19 is a top perspective view of a shelf incorporating an alternate embodiment of the support recess.
Figure 20:
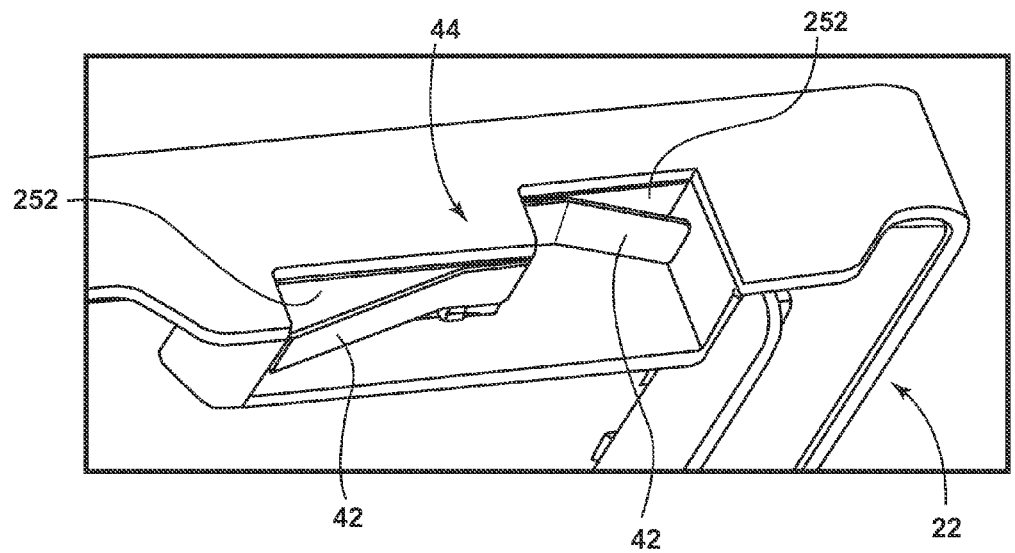
FIG. 20 is an enlarged perspective view of the support recess of FIG. 19.
Figure 21:
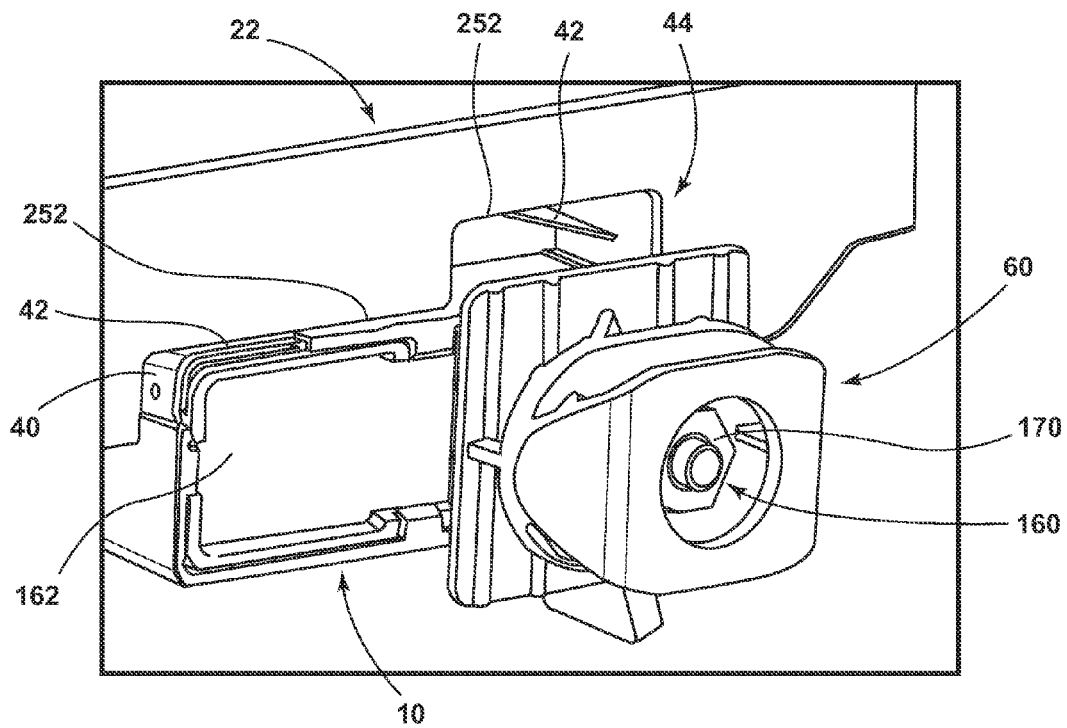
FIG. 21 is an enlarged perspective view of the adjustable flipper of FIG. 17 engaging the support recess of FIG. 20.

According to various embodiments, as illustrated in FIGS. 10, 15 and 16, the output of electricity from each of the electrical contacts 40 can also be controlled through various pressure-sensing mechanisms such that the electrical contacts 40 will only be configured to deliver electricity when a predetermined amount of pressure is placed upon one or more of the rotatable flippers 10 positioned at a particular vertical height within the cavity 12 of the appliance 14. In this manner, when the rotatable flippers 10 are static and no load is placed thereon, no electricity is provided to the electrical contact 40. When a shelf 22, or lighting fixture 24, is placed upon the rotatable flipper 10, the rotatable flipper 10 responds to the downward pressure placed thereon or through an inward pressure placed upon the electrical contact 40, through a biasing mechanism, deformation of the outer shell of the rotatable flipper 10, deformation of the electrical contact 40, or other similar pressure-related response. Such a pressure-related response serves to close a circuit and allow electrical current to flow from the electrical contact 40. In embodiments where the electrical receiver 42 places an inward force upon the electrical contact 40, a screw 170 disposed within the rotatable flipper 10 can serve as the mechanism that closes the circuit and allows electrical current to flow from the electrical contact 40. It is also contemplated that the shelf 22 and/or lighting fixture 24 can include a separate engagement feature proximate the electrical receiver 42 that cooperates with a portion of the rotatable body to close a circuit connected to the electrical system 20 of the appliance 14 and allow the electrical contact 40 to provide electrical current to the shelf 22 and/or the lighting fixture 24. In such an embodiment, the shelf 22 and/or lighting fixture 24 can include a specific physical feature that extends into a portion of the rotatable flipper 10 or engages the rotatable flipper 10 in a unique fashion that cannot be substantially reached or engaged by a body part or by typical food products and storage materials contained within an appliance 14. Accordingly, only the shelf 22 and/or lighting fixture 24 would be allowed to engage the various rotatable flippers 10 in order to close the circuit and allow for the flow of electrical current from to the electrical contact 40 and into the shelf 22 and/or the lighting fixture 24.

According to the various embodiments, it is contemplated that the electrical contact 40 can be positioned at an inner face 180 of the rotatable flipper 10 (shown in FIG. 15), such that the electrical contact 40 is positioned between the wall 18 and an inner surface 182 of the rotatable body. In this embodiment, the electrical contact 40 is difficult to reach with a body part or other article, but can be configured such that the electrical receiver 42 of the shelf 22 can be positioned proximate an outer wall 184 of the shelf 22 (shown in FIGS. 4 and 5) that fits between the rotatable flipper 10 and the wall 18 of the cavity 12, such that the engagement of the electrical contact 40 of the rotatable flipper 10 and the electrical receiver 42 of the shelf 22 and/or the lighting fixture 24 occurs in a position that is substantially inaccessible or inaccessible by a body part or food/beverage product to limit undesired and unintentional flow of electricity from the electrical contact 40 to an article that is not desired to receive electricity. It is contemplated that each of the electricity control features described herein can be used in combination with any one or more of the other features described herein.

Referring again to FIGS. 2-9, according to various embodiments, the electrical contact 40 of the rotatable flipper 10 can be disposed within an aperture 190 defined in the outer cover 130 of the rotatable flipper 10. In such an embodiment, the outer face 192 of the outer cover 130, and in turn the electrical contact 40, is positioned adjacent each support surface 62 of the rotatable flipper 10. It is also contemplated that the outer face 192 of the rotatable flipper 10 is configured to be perpendicular to each support surface 62. In such an embodiment, the rotatable flipper 10 can be a substantially cuboidal shape or substantially rectangular prism shape where the outer face 192 of the rotatable flipper 10 is substantially parallel with the wall 18 of the cavity 12 of the appliance 14 that the rotatable flipper 10 extends from. Each of the support surfaces 62 of the rotatable flipper 10 can then extend, as part of the outer cover 130, from the outer face 192 in a substantially normal direction toward the wall 18 of the cavity 12. It is contemplated that in such an embodiment, the electrical contact 40, in each of the support positions 26 of the rotatable body, is positioned sufficiently near each support surface 62 such that when the support recess 44 of the shelf 22 is placed upon the respective support surface 62, the electrical receiver 42 disposed within the support recess 44 of the shelf 22 is in an appropriate position to contact the electrical contact 40 of the rotatable body to allow delivery of electricity from the electrical system 20 of the appliance 14, through the stud 60 and the rotatable flipper 10, and into wiring 150 within the shelf 22 for operation of the various electrical mechanisms of the shelf 22.

According to the various embodiments, the electrical engagement between the electrical contact 40 and the electrical receiver 42 can be a surface to surface engagement that is free of a male/female connection. In this manner, the engagement between the electrical contact 40 and the electrical receiver 42 defines a friction fit electrical connection.

Figure 2:
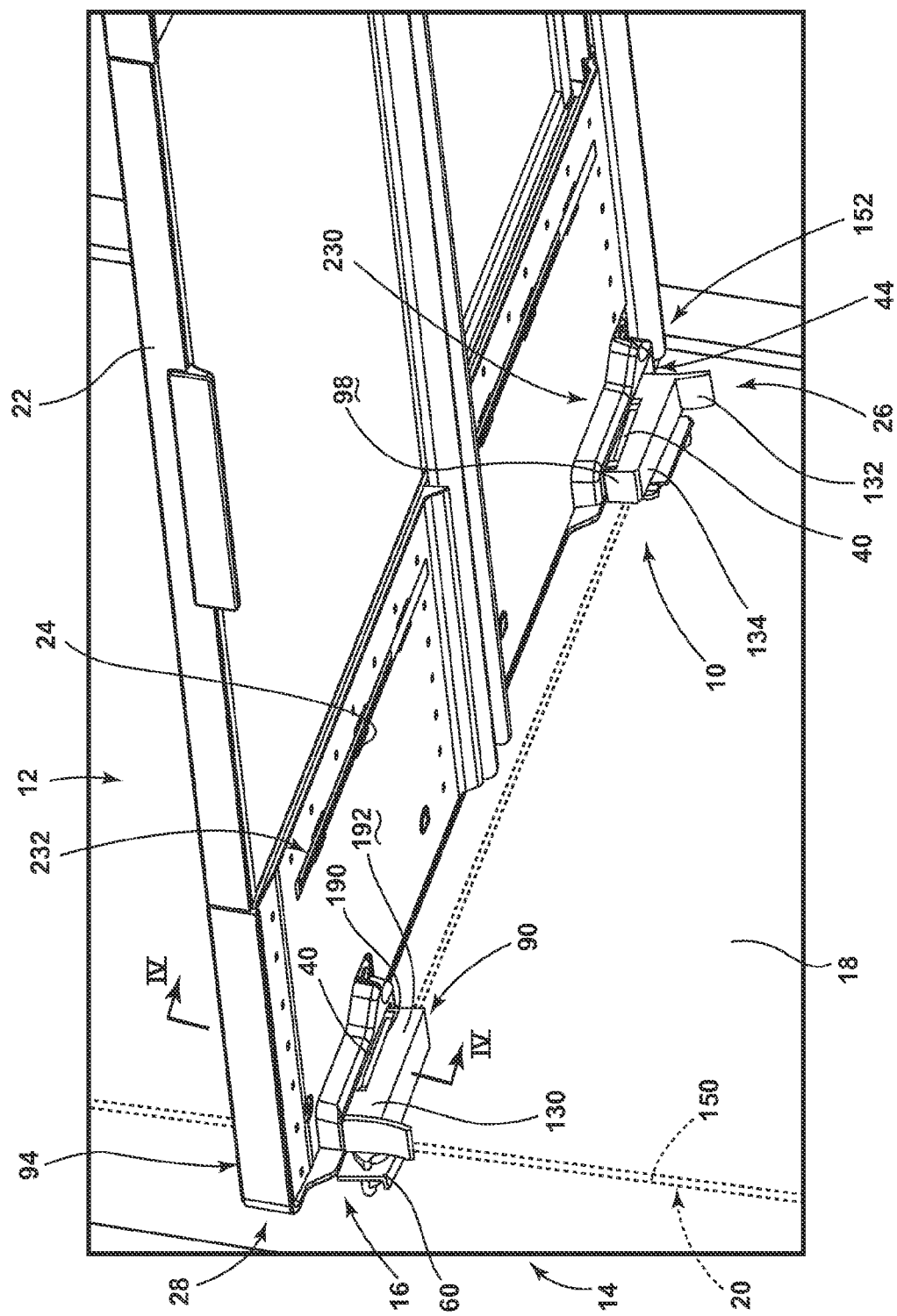
FIG. 2 is a bottom perspective view of one of the shelves of the appliance resting upon an embodiment of the shelf-supporting system, according to the embodiment illustrated in FIG. 1, with the adjustable flippers in the lower, first position.
Figure 3:
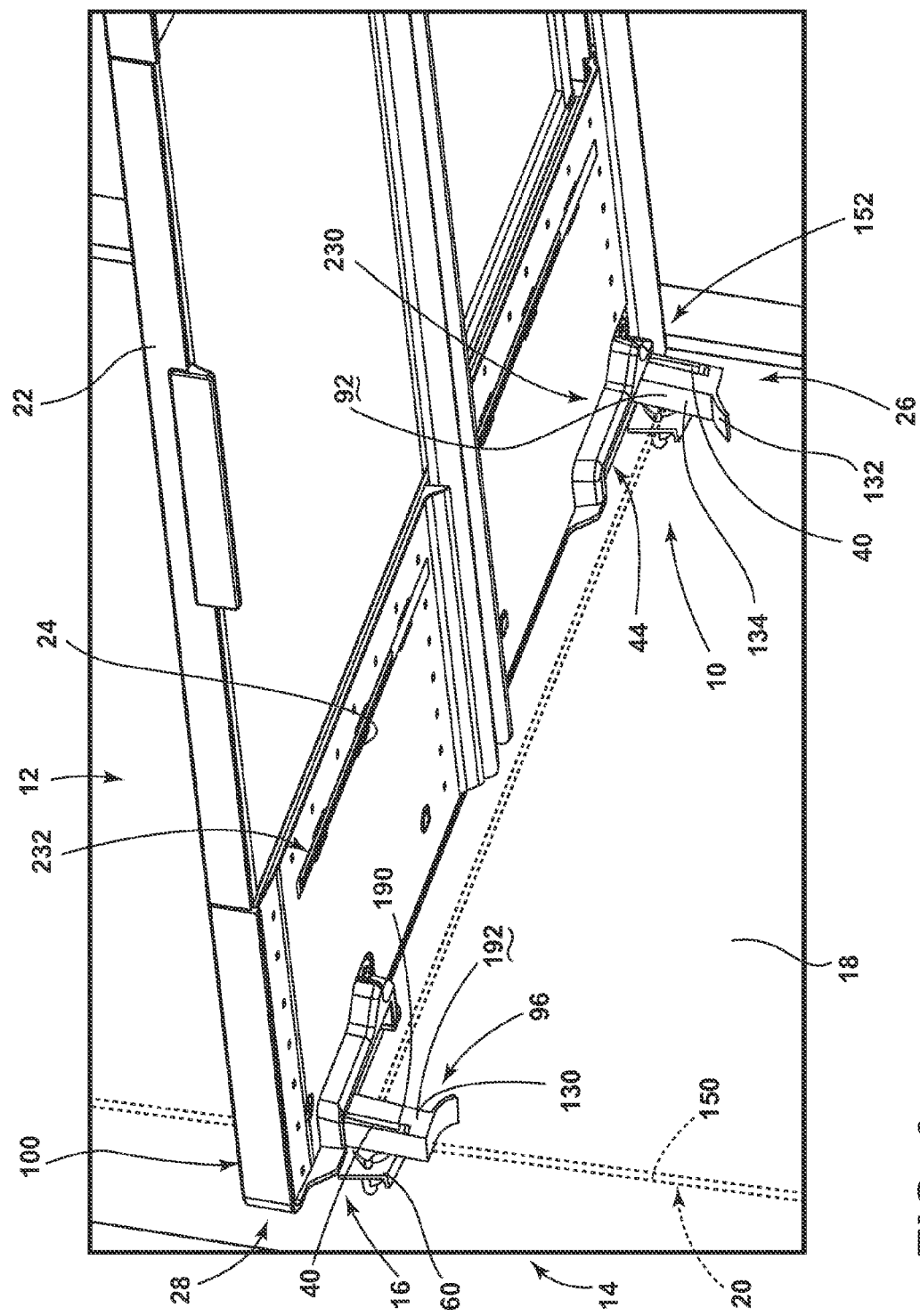
FIG. 3 is a bottom perspective view of one of the shelves of the appliance resting upon an embodiment of the shelf-supporting system, according to the embodiment illustrated in FIG. 1, with the adjustable flippers in the higher, second position.
Figure 4:
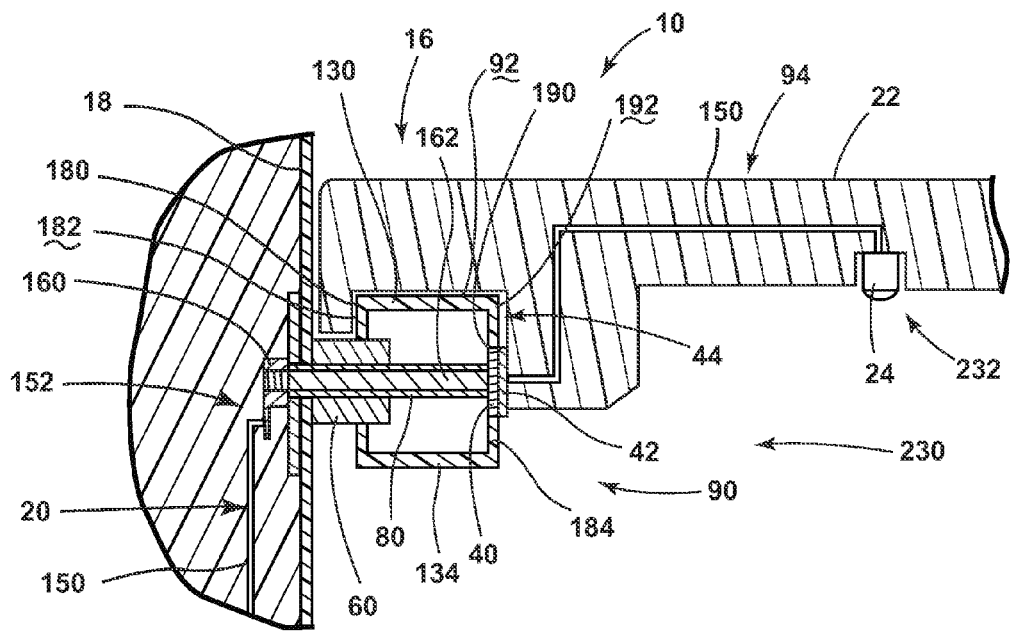
FIG. 4 is a cross-sectional view of the shelf-supporting system of FIG. 2, taken along line IV-IV.

Referring now to the embodiment illustrated in FIGS. 9-13, it is contemplated that the rotatable flipper 10 can define any number of support positions 26 that corresponds to each of the perimetrical sides 134 of the rotatable flipper 10. It is contemplated that each perimetrical support surface 62 extends from the outer face 192 of the rotatable flipper 10. It is also contemplated that the rotatable flipper 10 can include fewer support positions 26, and in turn, support surfaces 62, than the rotatable flipper 10 has perimetrical sides 134. By way of explanation, and not limitation, the various embodiments illustrated in FIGS. 2-7 and 11-12 illustrate a rotatable flipper 10 having two support positions 26 and two respective support surfaces 62. As shown in FIGS. 2 and 11, one of the support positions 26 includes a lower first support position 90 that corresponds to the lower shelf height 94. FIGS. 3 and 12 illustrate a higher second support position 96 that corresponds to the higher shelf height 100. As discussed previously, the offset engagement of the stud 60 with the rotatable flipper 10 allows the rotatable flipper 10, having a generally elongated configuration, to define the lower first rotational position and the higher second rotational position. These first and second rotational positions also provide a meaningful and discernable difference between the various respective shelf heights 28 of the shelves 22, when the shelf 22 is placed upon the rotatable bodies in each of the first and second rotatable positions.

According to the various embodiments, it is contemplated that each rotatable flipper 10 can be operably rotated between the plurality of support positions 26 by hand and without the use of tools. It is also contemplated that each of the rotatable flippers 10 can be rotated automatically, through a mechanical mechanism that can automatically rotate each of the rotatable flippers 10 to define each of the support positions 26. In embodiments where the various rotatable flippers 10 are manually operated, it is contemplated that the rotatable flippers 10 positioned within a particular vertical position 152 of the cavity 12 can be in communication with one another, such that when one of the rotatable flippers 10 is rotated, a connection mechanism between the other corresponding rotatable flippers 10 causes each of the rotatable bodies at a particular vertical position 152 within the cavity 12 to rotate simultaneously, when only one of the rotatable flippers 10 is manipulated between the plurality of rotational positions.

Referring now to the embodiment illustrated in FIGS. 17-21, the rotatable flipper 10 can include an electrical contact 40 that is positioned proximate a corner 250 of the rotatable flipper 10. In such an embodiment, the electrical contact 40 can wrap around two or more support surfaces 62 of the adjustable flipper 10. Additionally, it is contemplated that the electrical contacts 40 can be included as part of the support surfaces 62. Accordingly, the aperture 190 can similarly wrap around two or more support surfaces 62 in order to allow the electrical contact 40 to be exposed through the aperture 190 within the at least two adjoining support surfaces 62. As such, the various portions of the electrical contact 40 are configured to engage and connect to the electrical receiver of the shelf 22 in each of the support positions 26 of the rotatable flipper 10.

Referring again to the embodiment illustrated in FIGS. 17-21, the support recess 44 of the shelf 22 an include dedicated recess portions 252 that are configured to rest upon a corresponding support surface 62 of the rotatable flipper 10. It is contemplated that the dedicated recess portions 252 can further define the various shelf heights 28, where each dedicated recess portion 252 is set at a separate elevation within the shelf 22. Each of the dedicated recess portions 252 can include a respective electrical receiver 42 that engages a corresponding portion of the electrical contact 40. It is also contemplated that each dedicated recess portion 252 can include separate electrical receivers 42 that correspond to dedicated and in some cases separate, electrical functions of the shelf 22. In such an embodiment, each support position 26 can correspond to these dedicated electrical functions. Accordingly, when the rotatable flipper 10 is rotated between the plurality of support positions 26, various electrical functions can be engaged and/or disengaged as the rotatable flipper 10 is rotated to engage the various and corresponding dedicated recess portions 252.

Referring again to the embodiment illustrated in FIGS. 2-12, the shelf-supporting system 16 of the appliance 14 can also be used in conjunction with a height-adjustable lighting system for an appliance 14. In such an embodiment, a lighting fixture 24 can be removably engaged with the cavity 12 of the appliance 14. The operable support structure 230, corresponding to the shelf-supporting system 16 of the appliance 14 is configured to receive an engagement surface of the lighting fixture 24 such that the operable support structure 230 can support each lighting fixture 24. The operable support structure 230 is configured to be operable between the plurality of support positions 26, where each of the plurality of support positions 26 corresponds to a respective fixture height 232 for each lighting fixture 24. The operable support structure 230 includes an electrical contact 40 that is in communication with the electrical system 20 of the appliance 14. The electrical contact 40 is positioned to engage an electrical receiver 42 of the lighting fixture 24 when the engagement surface of the lighting fixture 24 is received by the operable support structure 230. This electrical engagement between the lighting fixture 24 and the operable support structure 230 is configured to occur in each of the plurality of support positions 26 of the operable support structure 230. Once the electrical contact 40 and the electrical receiver 42 of the lighting fixture 24 are engaged, the lighting fixture 24 is placed in communication with the electrical system 20 such that the lighting fixture 24 is operational to provide lighting to the cavity 12 of the appliance 14.

According to the various embodiments, the lighting fixture 24 can be one or more light emitting diode (LED) lighting fixtures 24 configured to be positioned within the cavity 12 of the appliance 14. As discussed previously, each of these LED lighting fixtures 24, or other similar lighting fixtures 24, can be disposed within a portion of a height-adjustable shelf 22, such as an underside of the shelf 22, to be positioned within the cavity 12 of the appliance 14. It is contemplated that the lighting fixture 24, similar to the shelving, can be removed from the cavity 12, and from the operable support structure 230, as well as the rotatable flippers 10 of the operable support structure 230, by hand and without the use of tools. It is also contemplated that in order to provide a greater degree of attachment between the shelves 22 and/or lighting fixtures 24 and the rotatable flippers 10, an additional mechanical attachment can be provided. Such attachments can include, but are not limited to, hasps, clasps, interference mechanisms, detents, mating protrusions, attachments requiring the use of tools, and other similar attachment mechanisms.

According to the various embodiments, the rotatable flippers 10 can be made up of any one of various rigid materials that can include, but are not limited to, plastic, polymer, ceramic, metal, rubber, composite materials, combinations of these materials, and other similar materials. According to the various embodiments, the rotatable flipper 10 can include an outer shell that is configured to be made of a substantially non-electrically conductive material, where the outer shell is configured to act as the primary structural support for the shelf 22 as it rests upon the rotatable body in each of the support positions 26. In such an embodiment, the outer shell can include the aperture 190 through which the electrical contact 40 is placed, wherein the electrical contact 40 is configured to engage the electrical receiver 42 of the shelf 22, or the lighting fixture 24, to deliver electricity thereto.

According to various embodiments, it is contemplated that the various rotatable flippers 10 can be disposed within a vertical track-type system where the rotatable flippers 10 can be moved vertically within the track system to provide greater vertical operability of the various shelves 22 of the appliance 14. Such a track system would include a minimal slot defined within the cavity 12 that extends along only a portion of the wall 18 of the cavity 12 of the appliance 14. Such a track system could be directly engaged with the electrical system 20 of the appliance 14 such that the track system itself can selectively provide electrical current to the rotatable flipper 10 for delivering electricity through the electrical contact 40 into the shelf 22 and/or light fixture of the appliance 14.

The invention claimed is:

1. A height-adjustable shelving system comprising:
    an appliance having a plurality of walls that define an interior cavity, the appliance having an electrical system that extends into at least one of the walls of the appliance;
    a shelf selectively disposed within the interior cavity and including a lighting fixture; and
    a shelf support system in communication with the electrical system and including at least one adjustable body operable between a plurality of support positions, the at least one adjustable body removably receiving and supporting the shelf, wherein each of the support positions of the at least one adjustable body corresponds to a different shelf height, and wherein removable engagement between the shelf and the at least one adjustable body in any of the plurality of support positions places the lighting fixture in communication with the electrical system, wherein the at least one adjustable body includes an electrical contact positioned to engage the shelf when the at least one adjustable body is in any of the plurality of support positions, wherein the shelf includes an electrical receiver configured to engage the electrical contact when the at least one adjustable body is in any of the plurality of support positions.

2. The height-adjustable shelving system of claim 1, wherein the at least one adjustable body is at least one rotatable flipper, and wherein the shelf is removable from the shelf support system and from the interior cavity by hand and without the use of tools.

3. The height-adjustable shelving system of claim 2, wherein the electrical receiver is positioned within a support recess of the shelf, and the support recess is configured to surround at least a portion of the rotatable flipper when the rotatable flipper is in any of the plurality of support positions.

4. The height-adjustable shelving system of claim 3, wherein the shelf support system includes a set of rotatable flippers for each shelf to be disposed within the interior cavity, and wherein at least one of the rotatable flippers of the set of rotatable flippers includes the electrical contact.

5. The height-adjustable shelving system of claim 4, wherein the set of rotatable flippers includes four rotatable flippers, and wherein each rotatable flipper includes the electrical contact.

6. The height-adjustable shelving system of claim 4, wherein the lighting fixture of the shelf can be placed in communication with the electrical system by engaging at least one electrical contact of the set of rotatable flippers.

7. The height-adjustable shelving system of claim 2, wherein the lighting fixture is an LED lighting fixture disposed on an underside of the shelf positioned from about 1½ to about 7 inches away from a refrigerator compartment engaging side surface of the shelf.

8. An operable shelf support for delivering electrical power to a light fixture disposed within a height-adjustable shelf fora refrigerator, the operable shelf support comprising:

a rotatable flipper having an electrical contact disposed therein, the rotatable flipper having a plurality of support positions and a plurality of support surfaces, wherein each support position of the plurality of support positions corresponds to a respective support surface of the plurality of support surfaces; and a stud extending from a wall of the refrigerator and in communication with an electrical system of the refrigerator and the electrical contact of the rotatable flipper, the rotatable flipper being rotatably disposed on the stud and rotatable about the stud between the plurality of support positions, wherein each respective support surface defined by the plurality of support positions is defined by a different height relative to the stud, and wherein each respective support surface is configured to receive and support a height-adjustable shelf and engage an electric receiver of the height-adjustable shelf to place a light fixture of the height-adjustable shelf in communication with the electrical system of the refrigerator through engagement of the electrical contact and the electric receiver.

9. The operable shelf support of claim 8, wherein the stud includes a post that extends into the rotatable flipper, the post being disposed in an offset configuration within the rotatable flipper such that rotation of the rotatable flipper about the post results in each of the plurality of support surfaces.

10. The operable shelf support of claim 8, wherein the stud includes a detent portion that cooperates with the rotatable flipper to selectively hold the rotatable flipper in each of the plurality of support positions.

11. The operable shelf support of claim 8, wherein the electrical contact is disposed within an outer face of the rotatable flipper, and wherein the outer face is positioned adjacent to each support surface.

12. The operable shelf support of claim 11, wherein the outer face of the rotatable flipper is perpendicular to each support surface.

13. The operable shelf support of claim 8, wherein the plurality of support positions of the rotatable flipper includes first and second support positions that define first and second support surfaces, respectively.

14. The operable shelf support of claim 8, wherein the rotatable flipper is operable between the plurality of support positions by hand and without the use of tools.

\* \* \* \* \*